United States Patent
Abel et al.

(10) Patent No.: US 10,288,980 B2
(45) Date of Patent: *May 14, 2019

(54) ONE-DIMENSIONAL PHOTONIC CRYSTAL WITH PILLARS HAVING A LAYER STRUCTURE

(71) Applicant: International Business Machines Corporation, Armonk, NY (US)

(72) Inventors: Stefan Abel, Zurich (CH); Paul F. Seidler, Thalwil (CH)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/618,955

(22) Filed: Jun. 9, 2017

(65) Prior Publication Data

US 2017/0307958 A1 Oct. 26, 2017

Related U.S. Application Data

(63) Continuation of application No. 15/087,100, filed on Mar. 31, 2016, now Pat. No. 9,715,158.

(51) Int. Cl.
*G02F 1/35* (2006.01)
*B82Y 20/00* (2011.01)
(Continued)

(52) U.S. Cl.
CPC ......... *G02F 1/3515* (2013.01); *G02B 6/1225* (2013.01); *G02F 1/035* (2013.01);
(Continued)

(58) Field of Classification Search
CPC .......... G02B 1/00; G02B 1/002; G02B 1/005; G02B 1/007; G02B 1/02; G02B 1/08;
(Continued)

(56) References Cited

U.S. PATENT DOCUMENTS

| 5,440,421 A | * | 8/1995 | Fan | ...................... | B82Y 20/00 216/24 |
| 5,600,483 A | * | 2/1997 | Fan | ...................... | B82Y 20/00 257/17 |

(Continued)

OTHER PUBLICATIONS

List of IBM Patents or Patent Applications Treated as Related; (Appendix P), Filed Jun. 9, 2017; 2 pages.

(Continued)

*Primary Examiner* — Loha Ben
(74) *Attorney, Agent, or Firm* — Cantor Colburn LLP; Daniel Morris

(57) ABSTRACT

Embodiments are directed to a (quasi) one-dimensional photonic crystal cavity. This cavity comprises a set of aligned pillars, where the pillars are embedded in a cladding. At least one of the pillars has a sandwich structure, wherein a layer of nonlinear optical material is between two layers of materials having, each, a refractive index that is higher than the refractive index of the nonlinear optical material. Embodiments can further include an all-optical modulator or an all-optical transistor, comprising a photonic crystal such as described above. Finally, embodiments are further directed to methods for modulating an optical signal, using such a photonic crystal cavity.

14 Claims, 4 Drawing Sheets

(51) Int. Cl.
    *G02B 6/122*     (2006.01)
    *G02F 1/035*     (2006.01)
    *G02F 1/03*     (2006.01)
    *G02B 6/10*     (2006.01)
    *H01S 5/10*     (2006.01)

(52) U.S. Cl.
    CPC ............ *G02F 1/3525* (2013.01); *B82Y 20/00* (2013.01); *G02B 6/10* (2013.01); *G02B 6/105* (2013.01); *G02B 6/107* (2013.01); *G02F 1/03* (2013.01); *G02F 2202/32* (2013.01); *H01S 5/105* (2013.01)

(58) Field of Classification Search
    CPC ........ G02B 6/10; G02B 6/105; G02B 6/1225; G02B 1/10; G02B 1/105; G02B 1/107; G02B 1/1225; B82Y 20/00; G02F 1/0009; G02F 1/0063; G02F 1/00; G02F 1/03; G02F 1/035; G02F 1/3515; G02F 1/3525; G02F 2202/32; H01S 5/105
    USPC ....... 359/241–245, 237, 258, 321, 322, 342, 359/344; 372/19–22, 92, 96, 102; 343/772, 909
    See application file for complete search history.

(56) References Cited

U.S. PATENT DOCUMENTS

| | | | | |
|---|---|---|---|---|
| 5,682,401 | A | * | 10/1997 | Joannopoulos ........ B82Y 20/00 372/92 |
| 6,058,127 | A | * | 5/2000 | Joannopoulos ........ B82Y 20/00 372/102 |
| 9,715,158 | B1 | * | 7/2017 | Abel .................... G02F 1/3515 |

OTHER PUBLICATIONS

Stefan Abel et al., "One-Dimensional Photonic Crystal With Pillars Having a Layer Structure", U.S. Appl. No. 15/087,100, filed Mar. 31, 2017.

\* cited by examiner

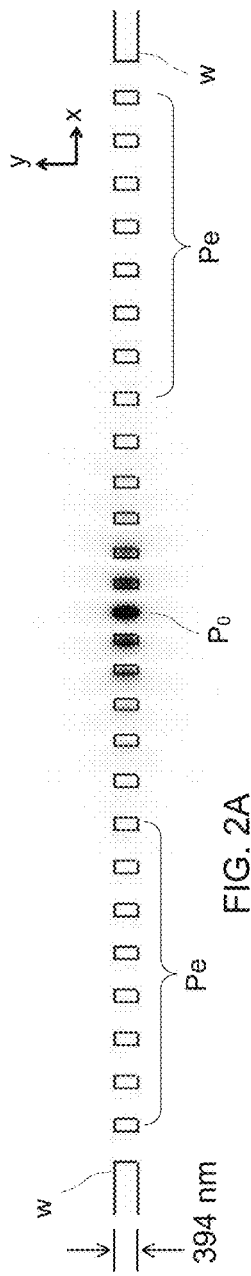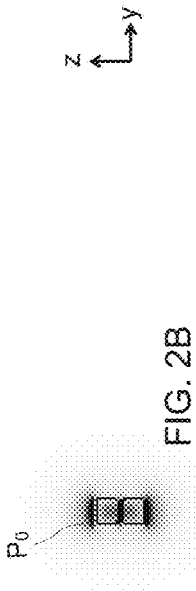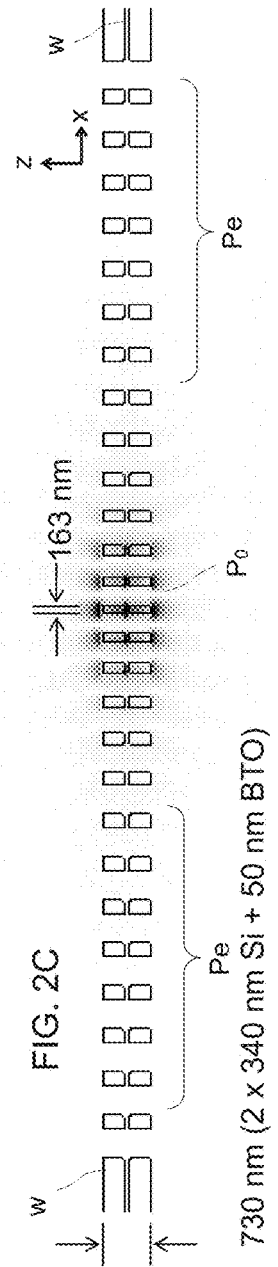
FIG. 2A
FIG. 2B
FIG. 2C

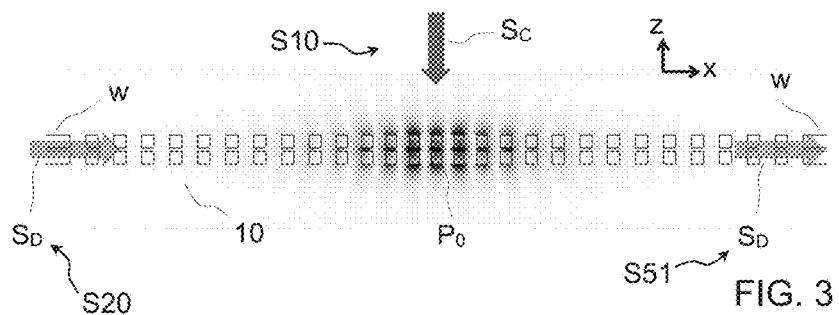

ONE-DIMENSIONAL PHOTONIC CRYSTAL WITH PILLARS HAVING A LAYER STRUCTURE

DOMESTIC PRIORITY

This application is a continuation of and claims priority from U.S. Patent Application Ser. No. 15/087,100, filed on Mar. 31, 2017, entitled "ONE-DIMENSIONAL PHOTONIC CRYSTAL WITH PILLARS HAVING A LAYER STRUCTURE," now U.S. Pat. No. 9,715,158 the content of which are incorporated herein by reference in its entirety.

BACKGROUND

One or more embodiments of the invention relate in general to optical devices, such as optical modulators and related devices. In particular, one or more embodiments concern a (quasi) one-dimensional photonic crystal cavity, which can be configured as an all-optical modulator, or an all-optical transistor, as well as related devices and apparatuses. One or more embodiments further concern methods for modulating an optical signal, e.g., a data signal, using such a photonic crystal cavity.

Optical modulators are used for high-speed optical data and telecommunication systems to encode data into a stream of light pulses. In current technology, electrical signals are typically converted to optical signals through various types of electro-optical modulators.

Furthermore, photonic crystals, which are natural or artificial structures with periodic modulation of the refractive index, are known in the art. Depending on the geometry of their structure, photonic crystals can be categorized as one-dimensional (1D), two-dimensional (2D) and three-dimensional (3D) structures. In one-dimensional photonic crystals, the periodic modulation of the permittivity occurs in one direction only. Known examples of photonic crystals are Bragg gratings, which are commonly used as distributed reflectors in vertical cavity surface emitting lasers.

Furthermore, quasi one-dimensional photonic crystals are known, e.g., comprising a freestanding cavity that comprises holes and a defect at the center (see e.g., P. B. Deotare, M. W. McCutcheon, I. W. Frank, M. Khan, and M. Lončar, "High quality factor photonic crystal nanobeam cavities," Appl. Phys. Lett. 94(12), 121106 (2009)). The central defect may be surrounded by tapered subsets of holes.

More generally, many optical devices are known, e.g., Fabry-Perot-like cavities and microcavities, which comprise an optical cavity. The geometry (including thickness or width) of the cavity determines the "cavity modes", i.e., particular electromagnetic field patterns formed by light confined in the cavity. An ideal cavity would confine light indefinitely (that is, without loss). The deviations from this ideal paradigm are either intentional (e.g., outcoupling) or due to design or fabrication related limitations or imperfections (e.g., scattering). They are captured by the quality factor Q, which is proportional to the confinement time in units of the optical period. Another important descriptive parameter is the effective mode volume (V), which relates to the spatial extent of the optical mode present in the cavity. In general, the realization of practical devices requires maximizing the ratio Q/V, i.e., high values for Q and low values for V are important to increase light-matter interactions in processes such as spontaneous emission, nonlinear optical processes and strong coupling.

More specifically, the quality factor or Q factor is a dimensionless parameter that is inversely related to the degree of damping or dissipation of an oscillator or resonator. The value of Q is usually defined as $2\pi$ times the total energy stored in the structure, divided by the energy lost in a single oscillation cycle. In optics, and more generally for high values of Q, the following definition can be adopted:

$$Q = \frac{f_r}{\Delta f} = \frac{\omega_r}{\Delta \omega}, \quad \text{Equation (1)}$$

where $f_r$ is the resonant frequency, $\Delta f$ is the bandwidth, $\omega_r = 2\pi f_r$ is the angular resonant frequency, and $\Delta \omega$ is the angular bandwidth. A cavity providing a larger Q confines the photons for a longer time.

The definition of the effective mode volume is, in the literature, usually inspired from Purcell effect calculations, giving rise to:

$$V_{\mathit{eff}} = \frac{\int \varepsilon(r)|E(r)|^2 dr^3}{\varepsilon(r_{max})\max(|E(r)|^2)}, \quad \text{Equation (2)}$$

where:
∈(r) is the dielectric constant as a function of the spatial coordinate r,
$r_{max}$ is the location of the maximum squared electric field, and
E(r)| is the electric field strength at the spatial coordinate r.

Eq. 2 is related to the spatial intensity enhancement factor at the point of maximum electric field intensity.

When a dimensionless effective mode volume is used (as assumed in the following description), the above formula need be multiplied by a factor $(n(r_{max})/\lambda_{vac})^3$, where $n(r_{max})$ is the index of refraction at the location of the maximum electric field and $\lambda_{vac}$ is the vacuum wavelength of the light.

SUMMARY

According to a first aspect, one or more embodiments of the present invention are embodied as a one-dimensional photonic crystal optical cavity. The cavity comprising a set of aligned pillars, where the pillars are embedded in a cladding. At least one of the pillars has a sandwich structure, wherein a layer of nonlinear optical material is between two layers of materials having, each, a refractive index that is higher than the refractive index of the nonlinear optical material.

In one or more embodiments, two or more, or even all of the pillars of the cavity have such a sandwich structure.

Furthermore, the photonic crystal cavity preferably comprises one or more pillars, on each side of the set of pillars of the cavity and aligned therewith, which are designed so as for a cavity frequency of said cavity to be within a photonic frequency bandgap of said cavity.

In one or more embodiments, the cavity comprises a defect, e.g., at a central portion of the set of pillars, where the defect is designed so as to cause an optical mode within said photonic bandgap. One or more pillars of the cavity may for instance be suitably dimensioned and/or spaced from each other to create said defect.

In one or more embodiments, the set of pillars comprises two tapered subsets of pillars on each side of said defect, wherein each of the two subsets of pillars is tapered both in dimensions of and gaps between pillars of said each of the two subsets, so as to match a Bloch mode index of a mirror portion of the photonic crystal cavity to an effective refractive index of the defect.

One or more embodiments of the invention can furthermore be embodied as an all-optical modulator or an all-optical transistor, comprising a photonic crystal cavity such as described above.

According to another aspect, one or more embodiments of the invention are embodied as a method for modulating an optical signal, using such a photonic crystal cavity. This can be achieved by irradiating the photonic crystal cavity with an optical control signal to modulate the optical signal propagated through said photonic crystal cavity. Conversely, the control signal may propagate in the photonic crystal cavity and modulate an optical signal irradiating the cavity. In other variants, both the control signal and the optical signal are propagated in the photonic crystal cavity. Yet, the signals have different frequencies, matching distinct optical modes of the cavity, which modes preferably have different quality factors.

Devices, apparatuses, and methods embodying the present invention will now be described, by way of non-limiting examples, and in reference to the accompanying drawings.

BRIEF DESCRIPTION OF THE DRAWINGS

FIG. 2A depicts the (x, y) plane at the level of the sandwiched nonlinear material (not depicted, for the sake of clarity of depiction);

FIG. 2B depicts the (y, z) plane at the level of the central pillar of the cavity;

FIG. 2C depicts the (x, z) plane as in FIG. 1B;

FIGS. 3-6 illustrates various methods for modulating an optical signal with a control signal, using a 1D photonic crystal cavity according to one or more embodiments. Each figure shows a density plot of the vertical ($E_z$) component of the electric field (in absolute value), superimposed to a schematic depiction of the photonic crystal cavity in different planes, in accordance with the method used. Namely:

FIG. 3 schematically illustrates a switching induced by irradiating the photonic crystal cavity from above with an optical control signal, where the optical signal to be modulated propagates through the photonic crystal cavity, according to one or more embodiments;

FIG. 4 schematically illustrates a switching induced in-plane, thanks to tapered waveguides, where the optical signal to be modulated propagates through the photonic crystal cavity, which is irradiated by an optical control signal, in-plane with the sandwiched nonlinear material, according to one or more embodiments;

FIG. 5 illustrates an in-plane switching, where the optical signal to be modulated now irradiates the photonic crystal cavity, while the control signal propagates through the photonic crystal cavity, according to one or more embodiments; and FIG. 6 illustrates another method, wherein both the control signal and the optical signal are propagated in the photonic crystal cavity, which signals have different frequencies, matching distinct optical modes of the cavity, to achieve an all-optical transistor.

Figure 1A:
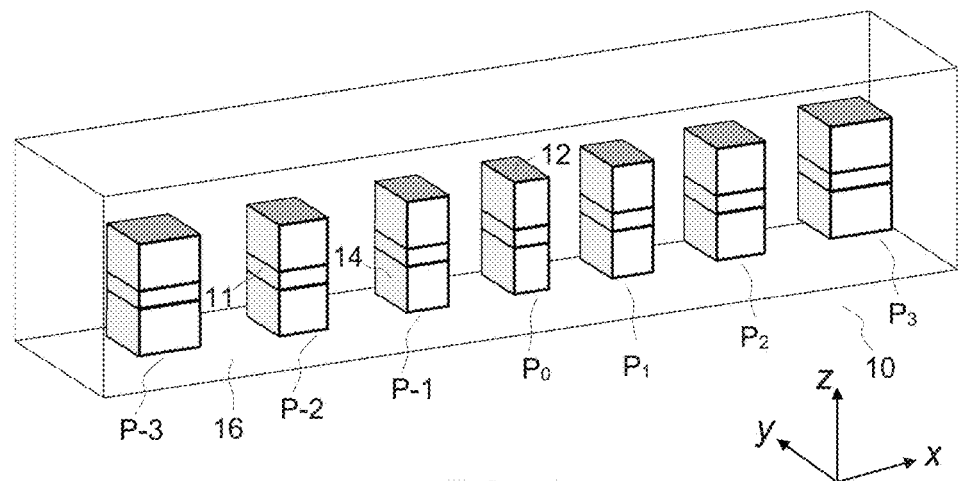
FIG. 1A is a 3D view of a portion of a cavity of a (quasi) 1D crystal cavity, according to one or more embodiments.

The accompanying drawings show simplified representations of devices or parts thereof, as involved in one or more embodiments. Technical features depicted in the drawings are not necessarily to scale. Similar or functionally similar elements in the figures have been allocated the same numeral references, unless otherwise indicated.

DETAILED DESCRIPTION

It would be desirable to have all-optical switching devices, in which one optical signal is used to switch another signal. Such devices would notably be useful for integrated optical circuits, as they do not require interconversion between electrical and optical signals. The concept of optical switching as used herein relates to the use of one optical signal to control another optical signal, i.e., to the control of light by light". Optical switching may for instance involve a change in the transmission of the device, which could occur, for example, by absorption, reflection, or even amplification.

According to one or more embodiments disclosed herein, all-optical switching can be achieved using a material with a large optical non-linearity, i.e., a material in which the index of refraction is altered by the presence of an optical field, for example due to the optical Kerr effect. However, because non-linear optical coefficients are often quite small, optically induced switching often requires high intensities and confinement of the electromagnetic field to small volumes. In other words, devices with a high quality factor-to-mode volume ratio would be necessary.

One or more embodiments provide a 1D photonic crystal cavity, which is described below. The disclosed photonic crystal cavity allows for ultra-compact all-optical modulators, which are suitable for integration into silicon photonic circuits.

One or more embodiments rely on a series of pillars, instead of holes, wherein one or more pillars comprise a sandwich structure, which allows integration of an optically active material (a non-linear material, such as barium strontium titanate). Such embodiments further make it possible to exploit defects in the cavity. One or more devices disclosed herein have an extremely high quality factor-to-mode volume ratio (>400000), where the optical field in the device is strongly confined in the non-linear material, leading to pronounced switching behavior, and permitting fast and efficient optical modulation.

The following description is structured as follows. First, descriptions of one or more general embodiments and high-level variants are provided. Following the general embodiments, one or more specific embodiments are provided.

General Embodiments and High-Level Variants

Figure 1B:
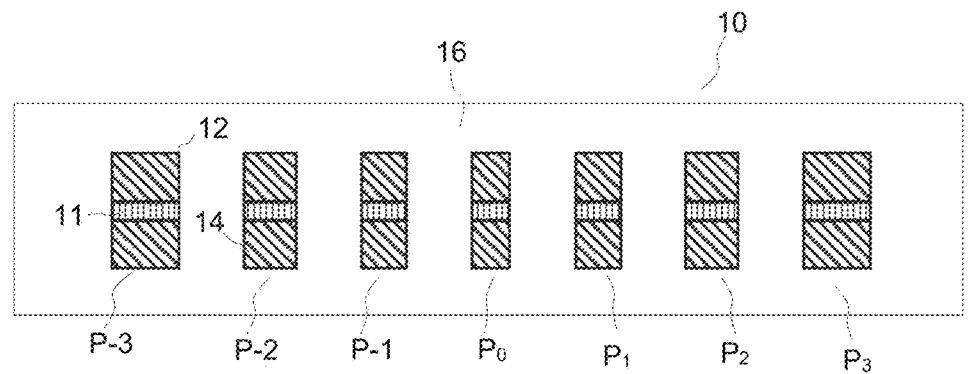
FIG. 1B is a 2D cross-sectional view of the cavity portion of FIG. 1A.

Referring generally to FIGS. 1-6, and in particular to FIGS. 1A-1B, one or more aspects of one or more embodiments of the invention are first described, which concerns a (quasi) one-dimensional photonic crystal cavity 10.

Note that the term "quasi" in the present disclosure is used to refer to the fact that the disclosed 1D devices per se are not a solid spanning three dimensions and is thus, strictly speaking, not a true 1D object. For ease of description, the specific term "quasi" is omitted in the following descriptions of the disclosed 1D devices.

The crystal cavity comprises a set of aligned pillars $P_i$, (e.g., $P_{-3}$-$P_3$ in FIG. 1A) where the pillars are embedded in a medium 16, i.e., a cladding. We note that, although the term "crystal" is used here, it does not imply that all of the pillars are equally spaced, as usual with photonic crystal cavities. As illustrated in FIGS. 1-7, the pillars $P_i$ of the cavity have, each, a layered structure, wherein a layer of nonlinear optical material 11, i.e., an optically active material, is sandwiched between two layers of materials 12, 14. The latter have, each, a refractive index that is higher than the refractive index of the nonlinear optical material 11 at the wavelengths of interest for optical applications, as exemplified later.

According to one or more embodiments, the above configuration allows the electric field (for a TM polarized mode) to be significantly increased within the optically active non-linear material. Because (i) the active material 11 has a lower index of refraction than layers 12, 14, and (ii) the optical mode is TM polarized (the electric field is perpendicular to the interfaces 11-12 and 11-14), there is an abrupt increase in the electric field within the active material 11, enhancing the electromagnetic (EM) field confinement in this region.

According to one or more embodiments, not all the pillars need have such a sandwich structure. Rather, at least one pillar (e.g., the central pillar $P_0$) need be structured, to enhance the EM confinement at the location of the nonlinear optical material 11 in such a pillar. Which pillar(s) to structure as a sandwich depends on the EM mode exploited and the geometry of the cavity, including symmetry. In variants, two or more of the pillars (e.g., the central pillars) may have this sandwich structure.

Thus, utilizing the teachings disclosed herein, a subset of the pillars may be designed to have a sandwich structure as described above. However, having all the pillars of the set with the same layer structure substantially simplifies the device fabrication process, without adversely impacting the quality factors. The latter happen to be very high, according to performed simulations, as explained below.

In fact, the pillars may further be provided with a more sophisticated sandwich structure, involving alternating layers of non-linear material and high-refractive-index material.

Note that the refractive index of the cladding 16, in which the pillars $P_i$ are embedded, just need be lower than the effective refractive index of the mode to be confined. Thus, the refractive index of the cladding 16, could, in principle, be higher than the refractive index of the nonlinear material 11. The effective refractive index of the mode depends on all of the materials 11, 12, 14, 16 involved and their dimensions. In practice, the cladding 16 typically has a refractive index that is lower than the refractive indices of the two layers 12, 14. In addition, the refractive index of the cladding 16 is typically lower than the refractive index of the non-linear optical material 11 too.

A 1D photonic crystal cavity as disclosed herein can be configured as an all-optical modulator (or an electro-optical modulator), or an all-optical transistor, according to one or more embodiments. This is described in detail below.

Referring now to FIGS. 2-7: the photonic crystal cavity 10 will typically comprise external pillars $P_e$, on each side of the defect (assumed in the center of the cavity in FIGS. 2-7), aligned with the other pillars of the cavity. The outermost pillars serve as mirrors for the cavity (they are not depicted in FIGS. 1A and 1B). They can be designed (e.g., periodically spaced) to create a bandgap, i.e., so as for the cavity frequency to be inside the photonic frequency bandgap of the cavity.

In one or more embodiments, the cavity comprises a defect $P_0$, e.g., at a central portion of the set of pillars $P_i$. This defect is generally designed so as to cause an optical mode within the photonic frequency bandgap. One or more pillars of the set $P_i$ may for instance be dimensioned and/or spaced from each other, so as to create said defect. In the following, this defect is assumed to be located at the center of the cavity. However, one may contemplate cases where the defect is off-centered, in accordance with a specific mode exhibiting off-centered maxima.

Moreover, and as illustrated in the appended drawings, the defect may be essentially formed by the central pillar $P_0$ or by a set of central pillars (i.e., pillars located between outermost, regularly spaced pillars $P_e$. To that aim, the dimensions and/or gaps of the central pillar $P_0$ and surrounding pillars may be varied. The dimensions and gaps of such pillars may notably be adjusted so as to match a Bloch mode index of the mirror portions (e.g., defined by outermost pillars $P_e$) of the crystal to an effective refractive index of the defect. This, in turn, makes it possible to gradually match the impedance of these two portions and, therefore, to achieve a high quality factor for the cavity mode. For instance, only the dimensions of the pillars $P_{-3}$-$P_{-1}$ and $P_1$-$P_3$ are varied in the examples of FIGS. 1A, 1B, while both the dimensions of and gaps between pillars of the subsets surrounding $P_0$ are varied in the examples of FIGS. 2-7. For instance, in the embodiment of FIGS. 2A-2C, the cavity pillars may comprise two tapered subsets of pillars, on each side of the central defect $P_0$, wherein each of the two subsets is tapered both in dimensions of and gaps between the pillars.

Figure 7:
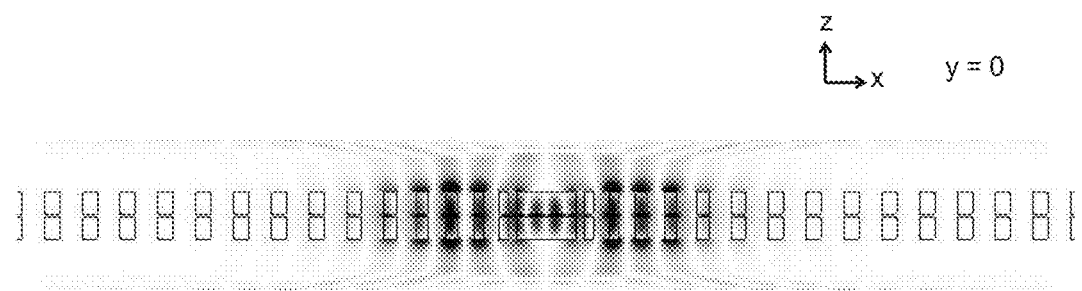
FIG. 7 shows a density plot of the vertical component ($E_z$) of the electric field (in absolute value), for a TM polarized optical mode of a cavity of a 1D photonic crystal cavity according to a variant to FIG. 2, where the density plots are superimposed to a schematic depiction of the photonic crystal cavity, in the (x, z) plane. The cavity comprises a defect at the center, which defect is designed so as to cause an optical mode within a photonic frequency bandgap of the cavity, and the pillar at the center is designed so as to encompass three nodes (lighter regions) of zero electric field of the cavity mode.

As further illustrated in FIG. 7, the present approach makes it possible to design a cavity where one or more pillars (e.g., at the center of the cavity as assumed in FIG. 7) encompasses one or more nodes (of zero electric field, along x) of the cavity mode (independently from any background electric field that might be present). In particular, pillars may be dimensioned so as to encompass nodes of zero electric field. I.e., at such nodes, the sign of the electric field of the cavity mode goes from positive to negative. In FIG. 7, three zero electric field nodes (correspond to lighter [white] regions) are encompassed within the central pillar. The advantage of this solution is that electrical leads may contact the pillar(s) at a location corresponding to said zero electric field nodes, so as to minimize induced perturbations.

In FIG. 2, the electric field (absolute value) was simulated for a device where all the pillars have a sandwich structure, including attached waveguides w for coupling light in and out. The nonlinear optical material 11 is $BaTiO_3$ (50 nm), for which the refractive index was taken as $n_1$=2.2). The outer layers 12, 14 are, each, assumed to be made of silicon ($n_2$=3.48) and are 340 nm thick. The depth of the pillars (along y) is 394 nm. The width of the central pillar is 163 nm. The external cladding was assumed to have a refractive index very close to that of air ($n_3$=1).

In the example of FIG. 2, the pillars are tapered linearly over five periods in both period and width (in the x direction) to 64% of their nominal value.

The electric field $E_z$ (absolute values) was simulated using a finite-difference time-domain (FDTD) simulation software package to model electromagnetic systems. As a result, the following values were obtained for the quality factor (Q), the dimensionless effective mode volume (V) and their ratio Q/V:Q=184000; V=0.16; and Q/V=1.1×10$^6$. Such values are very promising, it being reminded that optically induced switching requires confinement of the electromagnetic field to small volumes.

Other simulations were made (not shown), e.g., assuming Si outer layers 12, 14 being, each, 220 nm thick, and sandwiching a 50 nm thick layer of BaTiO$_3$, where the pillars are embedded in SiO$_2$ ($n_4$=1.444). The depth of the pillars (along y) is 540 nm. Here the taper was also assumed to be linear over five periods (along x), but the period and width were reduced to 78% of their nominal value. The width of the central pillar is 166.5 nm. As a result, the following values were obtained: Q=95000, V=0.21 and Q/V=4.5×10$^5$, which are, again, promising for the present purpose.

In variants, the nonlinear optical material 11 may for instance comprise Ba$_x$Sr$_y$TiO$_3$, KNbO$_3$, LiNbO$_3$, LiIO$_3$, AlN, GaN, GaP, InP, GaAs, ZnO, CdTe, Sr$_x$Ba$_{1-x}$Nb$_2$O$_6$, PbZr$_{0.52}$Ti0$_{.48}$O$_3$ (PZT), and LaTaO$_3$ Combinations of such materials can be contemplated, notably as the layer 11 may be made of several sublayers (of distinct materials), so as to form a more sophisticated sandwich structure, involving alternating layers of nonlinear material and high-index material, as noted earlier. The nonlinear material may also be an organic material, e.g., a polymer.

In particular, the material 11 may be a photorefractive material, e.g., BaTiO$_3$ (as assumed in FIG. 2), KNbO$_3$, and/or LiNbO$_3$. The photorefractive effect is a nonlinear optical effect causing a material to respond to light by altering its refractive index upon irradiation.

In particular, barium strontium titanate (Ba$_{0.5}$Sr$_{0.5}$TiO$_3$) is a material which is transparent at typical data- and telecommunication wavelengths (e.g., 1300 nm and 1550 nm). Such a material can be grown epitaxially on silicon and has an optical Kerr coefficient of 34 pm$^2$/V$^2$. Barium strontium titanate is therefore an attractive candidate for use in all-optical modulators or electro-optical modulators, especially thin-film devices with very small dimensions, as contemplated herein.

In other variants, the nonlinear optical material 11 may comprise a phase change material, or PCM, having at least two reversibly switchable states, in which the PCM exhibits two different values of refractive index. The reversibly switchable states are preferably optically switchable, so that they can be switched by irradiation, without requiring additional components (leads, electrodes, heaters, etc.). In that case, the outer layers 12, 14 need have, each, a refractive index that is higher than each (or even only one) of said two different values of refractive index. For example, the PCM may comprise TiN, GeSbTe and/or VO$_2$.

The materials listed above (optical nonlinear materials, including materials with a strong photorefractive effect, and materials exhibiting an optically triggered phase transition) make it possible to achieve all-optical switching and can furthermore advantageously be used in electro-optical modulators.

The layer 11 preferably has a thickness between 10 and 100 nm. The precise thickness of layer 11 may be jointly refined with the other relevant parameters, starting with the optical properties of materials 12, 14, 16 and the thicknesses of layers 12, 14.

The device 10 is preferably made compatible with silicon photonics technology, i.e., the active material 11 need be capable of being incorporated into the silicon structure. More preferably, the active material should have low absorption and scattering losses at the optical wavelength to be modulated.

The cladding 16 may for instance comprise SiO$_2$, SiO$_x$N$_y$, Al$_2$O$_3$, or, even, an organic material such as a polymer. Even the cladding may essentially comprise air or vacuum, in which case, the pillars would connect to an underlying substrate (not shown). We note, in that respect, that it is not required that the pillars be symmetric in the z direction.

The outer layers 12, 14 may, each, be essentially made of silicon, germanium, or, even, a polymer (having a suitable refractive index) and, typically, have a thickness between 100 nm and 1000 nm. When using silicon, which is notably advantageous for reasons of technological compatibility, the thickness of the silicon layers 12, 14 can be chosen to match that of the top silicon layer in standard silicon-on-insulator (SOI) wafers, i.e., 220 nm (±20 nm). More generally, the outer layers 12, 14 may, each, comprise one or more of the following materials: Si, Ge, GaAs, InAlGaAs, InP, GaP, GaN and AlN. Combinations of such materials can be contemplated. Referring now to FIGS. 3-7: according to another aspect, one or more embodiments of the invention can be embodied as a method for modulating an optical signal S$_D$. Such a method relies on a photonic crystal device 10 as described above. Several variants are described below, wherein an optical signal is propagated through the device 10 or irradiates the latter and is modulated by a control signal irradiating the photonic crystal cavity 10 or being propagated therein.

Referring first to FIGS. 3, 4, the method may, in one or more embodiments, comprise irradiating (steps S10, S15) the photonic crystal cavity 10 with an optical control signal S$_C$ to modulate S51, S52 an optical signal S$_D$ propagated S20 through said photonic crystal cavity. The optical signal S$_D$ is hereafter assumed to be a data signal, without prejudice.

As illustrated in FIG. 3, the control signal S$_C$ may for instance be directed S10 toward the photonic crystal cavity, perpendicularly to the average plane of layer 11. A switching of the data signal can for instance be achieved by free-space irradiation S10 of the device 10 from above (along axis z).

The switching mechanism involves any of the effects described above which change the refractive index of or absorption by material 11. This change causes either a shift in the resonance frequency of the cavity or a loss of light through absorption. In either case, the transmission of the device at the signal frequency is modified.

In variants, the control signal S$_C$ may irradiate the photonic crystal cavity in-plane S15 with the average plane of layer 11, and preferably via in-plane, tapered waveguides 22, 24, for smooth ejection of the optical mode, to achieve a switching as illustrated in FIG. 4. Here, "in-plane" means that the control signal is applied in the same plane as the average plane of the nonlinear material (it does not refer to the plane of the electric field). We note that the waveguides do actually not systematically need to be tapered. In fact, and as the skilled person may realize, it may be preferable, in some situations, not to taper the waveguides.

Conversely, one may, in one or more embodiments, propagate S30 the control signal S$_C$ in the device 10 and irradiate S35 the photonic crystal cavity with an optical signal S$_D$, so as to modulate S53 the latter, as illustrated in FIG. 5.

Figure 6:
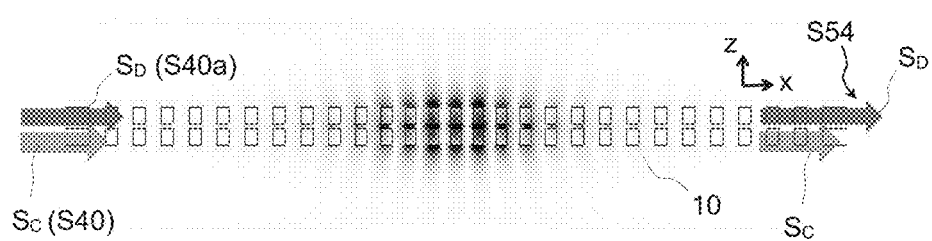

Finally, referring to FIG. 6, in one or more embodiments of the method, both the optical control signal S$_C$ and the data signal S$_D$ may be propagated S40, S40a in the device 10. In that case, both signals S$_C$ and S$_D$ need have distinct frequencies, matching distinct optical modes of the cavity (and having distinct quality factors). By choosing the frequency of the control signal S$_C$ to match the mode with the higher quality factor, a relatively low-power control signal $S_C$ can be used to alter the index of refraction of the device and, in turn, switch transmission of a higher power data signal $S_D$. The device can thus be operated as an all-optical transistor.

Note, however, that it is not essential that the quality factors be distinct in that case, as long as the two different frequencies interact with different strengths with the nonlinear material. This can for instance be achieved using distinct quality factors, but it can also result simply from the response of the nonlinear material to different frequencies.

The above embodiments have been succinctly described in reference to the accompanying drawings and may accommodate a number of variants. Several combinations of the above features may be contemplated. Examples are given in the next section.

Finally, we note that, although all-optical modulation is mostly contemplated herein, a device 10 as described above may be switched electrically (electro-optical modulation), through leads connected to one or more of the pillars.

Specific Embodiments—Technical Implementation Details

The device described in this section consists of a series of pillars defining a quasi-one-dimensional photonic crystal cavity for TM polarized light (collinear with a simple waveguide). Each pillar has a sandwich structure with an optically active material, such as barium strontium titanate, embedded between silicon layers, as described in sect. 1. The difference in the refractive indices of the layers and the fact that the optical mode is TM polarized (the electric field perpendicular to the average plane of layer 11) result in an abrupt increase in the electric field within the active material, thereby enhancing confinement in this region.

The thickness of the Si layers can be chosen to match the thickness of the top silicon layer of standard silicon-on-insulator (SOI) wafers, e.g. 220 nm, so as to allow a simple fabrication process, as evoked earlier.

The crystallographic orientation and thickness of the active material layer 11 is chosen for optimal non-linear effects, e.g., to enhance nonlinear coupling and to result in a concentration of the electromagnetic field. The dimensions and spacing of the outer pillars Pe, i.e. those not part of the taper or defect, are chosen to create a photonic frequency bandgap around the cavity frequency, so as for such pillars to serve as mirrors defining the cavity. The dimensions of the center pillar are chosen to create a defect in the sequence of pillars producing an optical mode within the photonic bandgap. The inner pillars next to the center pillar are tapered in dimension and spacing so as to match the Bloch mode index of the mirror portion of the device to the effective refractive index of the defect portion, thus matching the impedance of these two portions of the structure and leading to a high quality factor for the cavity mode. In principle, the dimensions of the defect region could be chosen to support any optical mode confined by the cavity. However, the symmetric fundamental mode with one antinode in the center pillar shall typically result in the most compact structure with a high quality factor-to-mode volume ratio.

Switching of the device is achieved through irradiation with an optical control signal. Numerous possibilities exist for directing the control signal toward the cavity, such as free-space irradiation from above, or in-plane irradiation from a waveguide directing light toward the device from the side, as described earlier in reference to FIGS. 3-5. In the latter case, the waveguide directing light from the side is preferably tapered for smooth ejection of the optical mode. The control signal could also pass longitudinally through the device, in which case the data signal to be modulated would pass through the side waveguides, FIG. 5.

Another, particularly interesting alternative is for both the control signal and the data signal to pass longitudinally through the device. In this case, the control signal and data signal have different frequencies matching two different optical modes of the cavity. Choosing the frequency of the control signal to match the mode with the higher quality factor and that of the data signal to match the mode with the lower quality factor, a relatively low-power control signal can be used to alter the index of refraction of the device and, in turn, switch transmission of a higher power data signal. The device thus behaves as an all-optical transistor.

The quality factor of the device is related to the number of pillars. Reducing the number of pillars reduces the quality factor, which implies a shorter response time. Thus the device can be optimized for different conditions. If a high quality factor is required for long interaction times between the light and the active material, a large number of pillars need be used. For fast response and high bandwidth, a smaller number of pillars is preferred.

The devices described above can be incorporated into integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip can then be integrated with other chips, discrete circuit elements, and/or other signal processing devices as part of either (a) an intermediate product, such as a motherboard, or (b) an end product. The end product can be any product that includes integrated circuit chips, ranging from low-end applications to advanced computer products.

While the present invention has been described with reference to a limited number of embodiments, variants and the accompanying drawings, it will be understood by those skilled in the art that various changes may be made and equivalents may be substituted without departing from the scope of the present invention. In particular, a feature (device-like or method-like) recited in a given embodiment, variant or shown in a drawing may be combined with or replace another feature in another embodiment, variant or drawing, without departing from the scope of the present invention. Various combinations of the features described with respect to any of the above embodiments or variants may accordingly be contemplated that remain within the scope of the appended claims. In addition, many minor modifications may be made to adapt a particular situation or material to the teachings of the present invention without departing from its scope. Therefore, it is intended that the present invention not be limited to the particular embodiments disclosed, but that the present invention will include all embodiments falling within the scope of the appended claims. In addition, many other variants than explicitly mentioned above can be contemplated. For example, other materials than those explicitly cited can be contemplated.

What is claimed is:

1. A method for modulating an optical signal, using a photonic crystal cavity, comprising:
   configuring the photonic crystal cavity with a cladding and a set of aligned pillars embedded in the cladding;
   configuring at least one of the pillars of the set to include a sandwich structure;

applying a layer of nonlinear optical material between two layers of materials having, each, a refractive index that is higher than the refractive index of the nonlinear optical material; and irradiating the photonic crystal cavity with an optical control signal to modulate an optical signal propagated through said photonic crystal cavity.

2. The method of claim 1, wherein:

irradiating comprises directing the control signal toward the photonic crystal cavity perpendicularly to an average plane of the layer of nonlinear optical material or in-plane with said average plane.

3. The method of claim 1, further comprising:

propagating both an optical control signal and the optical signal in the photonic crystal cavity, wherein the control signal has a first frequency, which matches a first optical mode of the photonic crystal cavity, and the optical signal has a second frequency, which matches a second optical mode of the photonic crystal cavity, the second optical mode having a lower quality factor than the first optical mode, so as to modulate said optical signal.

4. The method of claim 1, wherein each of the pillars of the set has a sandwich structure as said at least one of the pillars.

5. The method of claim 1, wherein the cavity further comprises pillars on each side of said set of pillars and aligned therewith, that are configured for a cavity frequency of said cavity to be within a photonic frequency bandgap of said cavity.

6. The method of claim 5, wherein the cavity comprises a defect formed by a subset of said set of pillars, the defect being configured to cause an optical mode within said photonic frequency bandgap.

7. The method of claim 6, wherein pillars of said subset are dimensioned and/or spaced from each other so to as to create said defect.

8. The method claim 7, wherein one or more pillars of said subset are designed so as to encompass one or more nodes of zero electric field of a cavity mode.

9. The method of claim 8, wherein the set of pillars comprises:

two tapered subsets of pillars on each side of said defect, wherein each of the two subsets of pillars is tapered both in dimensions of and gaps between pillars of said each of the two subsets, so as to match a Bloch mode index of a mirror portion of the photonic crystal cavity to an effective refractive index of the defect.

10. The method of claim 1, wherein:

said nonlinear optical material comprises one or more of the following materials: $BaTiO_3$, $Ba_xSr_yTiO_3$, $KNbO_3$, $LiNbO_3$, $LiIO_3$, AlN, GaN, GaP, InP, GaAs, ZnO, CdTe, $Sr_xBa_{1-x}Nb_2O_6$, $PbZr_{0.52}Ti_{0.48}O_3$, and $LaTaO_3$.

11. The method of claim 1, wherein:

said nonlinear optical material comprises a phase change material (PCM) having at least two reversibly switchable states, in which the PCM exhibits two different values of refractive index, said states being optically switchable; and said two layers of materials have, each, a refractive index that is higher than at least one of said two different values of refractive index.

12. The method of claim 1, wherein said nonlinear optical material comprises a photorefractive material.

13. The method of claim 1, wherein said cladding comprises one or more of: $SiO_2$; $SiO_xN_y$; $Al_2O_3$; and an organic polymer.

14. The method of claim 1, wherein said two layers of materials comprise, each, one or more of any of the following: Si; Ge; GaAs; InAlGaAs, InP; GaP; GaN; and AlN.

* * * * *